(12) United States Patent
Acar et al.

(10) Patent No.: US 8,510,699 B1
(45) Date of Patent: Aug. 13, 2013

(54) PERFORMANCE DRIVEN LAYOUT OPTIMIZATION USING MORPHING OF A BASIS SET OF REPRESENTATIVE LAYOUTS

(75) Inventors: Emrah Acar, Montvale, NJ (US); Aditya Bansal, White Plains, NJ (US); Rama N. Singh, Bethel, CT (US); Amith Singhee, Yonkers, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/416,588

(22) Filed: Mar. 9, 2012

(51) Int. Cl.
  *G06F 17/50* (2006.01)
  *G06F 9/455* (2006.01)

(52) U.S. Cl.
  USPC ............................ 716/119; 716/110; 716/132

(58) Field of Classification Search
  USPC ......................................... 716/110, 119, 132
  See application file for complete search history.

(56) References Cited

U.S. PATENT DOCUMENTS

| 6,412,100 | B1 | 6/2002 | Sasagawa et al. | |
|---|---|---|---|---|
| 2005/0229131 | A1* | 10/2005 | Wu et al. | 716/8 |
| 2006/0090146 | A1* | 4/2006 | LeBritton et al. | 716/4 |
| 2007/0250804 | A1 | 10/2007 | Melvin, III et al. | |
| 2008/0092102 | A1* | 4/2008 | Hsieh | 716/18 |
| 2010/0058265 | A1 | 3/2010 | Finkler | |
| 2010/0242000 | A1* | 9/2010 | Strenski et al. | 716/4 |
| 2011/0207034 | A1* | 8/2011 | Fu | 430/5 |
| 2011/0289472 | A1* | 11/2011 | Finkler et al. | 716/136 |
| 2013/0061184 | A1* | 3/2013 | Guo et al. | 716/52 |

OTHER PUBLICATIONS

J. Barth et al, "A 45nm SOI embedded DRAM macro for the POWER7TM processor 32MByte on-chip L3 cache," Int. Solid State Circ. Conf., (2010).
J. Warnock et al, "POWER7TM local clocking and clocked storage elements," Int. Solid State Circ. Conf., (2010).
S.R. Nassif and K.J. Nowka, "Physical design challenges beyond the 22nm node," Int. Symp. Phys. Des. (2010).
T. Beier and S. Neely, "Feature-based image metamorphosis," SIGGRAPH (1992).
K. Nii et al., "A 90nm dual-port SRAM with 2.04 µm2 8T-thin cell using dynamically-controlled column bias scheme," Int. Solid State Circ. Conf. (2004).
A. Bansal et al., "Yield estimation of SRAM circuits using 'Virtual SRAM Fab'," ICCAD (2009).
C.A. Mack, "Thirty years of lithography simulation," SPIE, 5754 (2004).

(Continued)

*Primary Examiner* — Suresh Memula
(74) *Attorney, Agent, or Firm* — Preston Young; Michael J. Chang, LLC

(57) ABSTRACT

Techniques for generating variants of a circuit layout and evaluating quality of the variants are provided. In one aspect, a method for generating at least one variant layout for a cell design includes the following steps. At least a first basis layout and a second basis layout are obtained for the cell design, each having a plurality of shapes, each of the shapes being a polygon having a plurality of sides and vertices. One or more of the shapes in the first basis layout are linked with one or more of the shapes in the second basis layout that represent a common feature of the cell design resulting in a plurality of linked shapes. Starting with either the first basis layout or the second basis layout, a location of the vertices of each of the linked shapes are changed to produce the variant layout for the cell design.

21 Claims, 9 Drawing Sheets

(56) References Cited

OTHER PUBLICATIONS

N. Cobb, "Fast optical and process proximity correction algorithms for integrated circuit manufacturing," Ph.D. Thesis, U. California, Berkeley (1998).

P.T. Chapman et al., "The scan line approach to design rules checking: Computational experiences," DAC (1984).

A. Lvov et al., "Exact Basic Geometric Operations on Arbitrary Angle Polygons Using Only Fixed Size Integer Coordinates," ICCAD (2008).

F.L. Hammond et al., "Improvement of Redundant Manipulator Task Agility Using Multiobjective Weighted Isotropy-Based Placement Optimization," Proceedings of the 2009 IEEE International Conference on Robotics and Biometrics, Dec. 19-23, 2009, Guillin, China AN-11153325 (2009).

H. Dong, "Physics-Based Shape Morphing and Packing for Layout Design," A Dissertation Presented to the Graduate School of Clemson University, May 2008.

* cited by examiner

HAMMER
102
POLYSILICON-
PAST-DIFFUSION

BOTTLE
102
POLYSILICON-PAST-DIFFUSION

200

ASSOCIATING SHAPES IN THE BASIS LAYOUTS BASED ON THEIR DESIGN PURPOSE — 202

MAP/LINK ASSOCIATED SHAPES IN THE BASIS LAYOUTS, WHEREIN EACH SHAPE IS TREATED AS A POLYGON — 204

EXTRACT POLYGON VERTICES — 206

USING THE EXTRACTED POLYGON VERTICES TO GENERATE VARIANTS OF THE SHAPES — 208

ASSOCIATING POLYGON VERTICES

FIG. 5

| FEATURE | DIM. | Mnemonic | DESCRIPTION |
|---|---|---|---|
| DISTANCE | 1 | DIST_L1_L2_<t> | Distance between nearest edges of an L1 shape and an L2 shape. |
| PAST | 1 | PAST_L1_L2_<t> | Overhang of L1 shape beyond L2 shape. L1 ≠ L2. |
| WIDTH | 1 | WIDTH_L1_<t> | Width of shape on L1. |
| AREA | 2 | AREA_L1_<t> | Area of shape on L1. |
| OVERLAP AREA | 2 | AREA_L1_L2_<t> | Overlap area of L1 shape and L2 shape. L1 ≠ L2. |

FIG. 6

| MARKER MEASUREMENT OPS | DESCRIPTION |
|---|---|
| DIST_L1_L2<br>M1 = M − L1<br>M1t = M1.Touch(L2)<br>MMT = M1t − L2 | The portion of marker M that lies between the edges of L1 and L2. Ignore any overshoots of M beyond L1 or L2. |
| DIST_L1_L2<br>M1 = M − L1<br>MMT = M1.TouchTwice(L1) | The portion of marker M that lies between the edges of two L1 shapes. Ignore any overshoots of M beyond these shapes. |
| AREA_L1<br>MMT = L1.Touch(M) | The shape in L1 touching the marker M. |
| AREA_L1_L2<br>L1' = L1.Touch(M)<br>L2' = L2.Touch(M)<br>L12 = L1' ∩ L2'<br>MMT = M12.Touch(M) | The one overlap area of L1 and L2 that touches the marker M. |
| WIDTH_L1<br>MMT = L1 ∩ M | The portion of marker M that is enclosed within an L1 shape. |

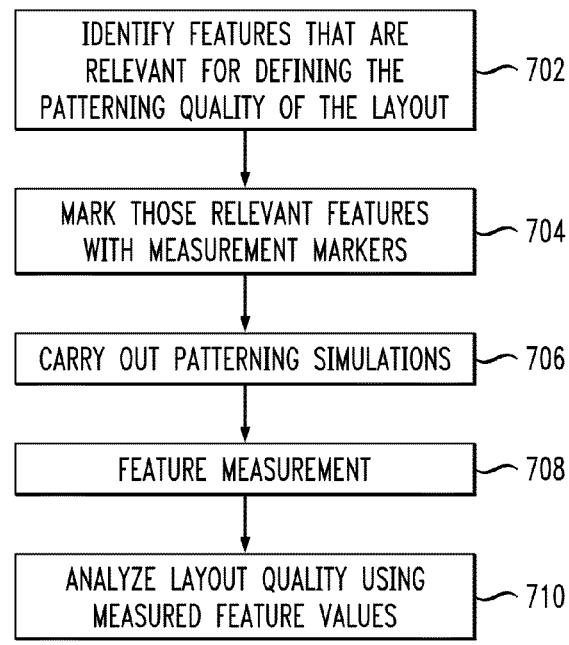
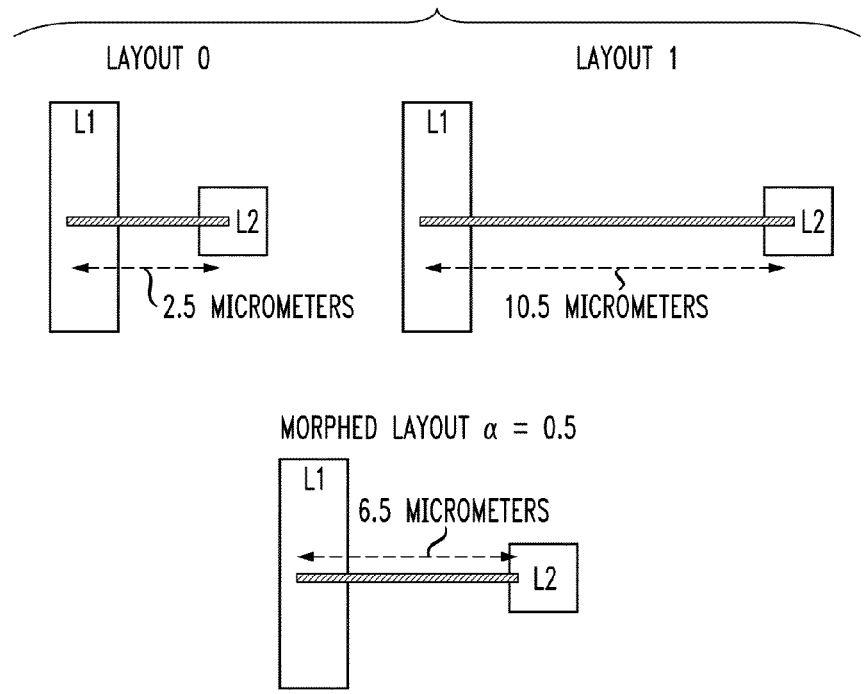

900

LAYOUT 0 (L0)

LAYOUT 1 (L1)

1. DIST_L4_L4
2. DIST_L5_L5
3. DIST_L3_L3
4. DIST_L7_L7
5. DIST_L7_L2_tag
6. DIST_L7_L1
7. DIST_L2_L2_tag1
8. DIST_L2_L2_tag2
9. DIST_L1_L1
10. DIST_L1_L1_tag
11. PAST_L6_L2
12. PAST_L7_L2
13. AREA_L3_L4
14. AREA_L7_L5
15. AREA_L2_L4
16. AREA_L2_L5
17. AREA_L8_L3

PERFORMANCE DRIVEN LAYOUT OPTIMIZATION USING MORPHING OF A BASIS SET OF REPRESENTATIVE LAYOUTS

FIELD OF THE INVENTION

The present invention relates to cell layout design and more particularly, to automated techniques for generating variants of a cell layout and evaluating patterning quality of the variants for efficient design space exploration.

BACKGROUND OF THE INVENTION

Traditional layout design has relied on design rules as a model for process capability and a measure of design quality. At highly-scaled technology nodes such as 22 nanometers (nm), many scenarios exist where design rules are inaccurate or inapplicable.

Circuits such as static random access memory (SRAM) bitcells, embedded dynamic random access memory (eDRAM) bitcells (see, for example, J. Barth et al, "A 45 nm SOI embedded DRAM macro for the POWER7™ processor 32 MByte on-chip L3 cache," Int. Solid State Circ. Conf, (2010)) and latches are highly replicated across the chip making them area and yield critical, while being performance and power critical at the same time. Aggressive designs even at the 45 nm node exist with over 2 million clocked storage elements (latches). See, for example, J. Warnock et al, "POWER7™ local clocking and clocked storage elements," Int. Solid State Circ. Conf., (2010). The high-density requirements for these circuits make design rules too conservative in highly-scaled technologies. The reason for this is that design rules are developed to cater to arbitrary circuits and layouts. For vertically integrated circuit manufacturers who design the circuits and define and perform manufacturing process steps, all parts of the layout should be customized to the process capability, and the emerging manufacturing process should be customized for the layout. This is a highly specialized and important task to achieve high-performance integrated circuits with higher density and performance requirements. For specialized circuit design companies who utilize other manufacturing facilities (also known as fabrication facilities or fabs for short), such inter-related design/process collaboration exists to achieve best mutual gains both in product performance and cost requirements.

To achieve the best combination of layout and process, very fine tuning of the layout features is required, aided by maximum accuracy patterning simulation checks that account for the variability in the process. Physical design at a macro or global scale has seen much advancement in the last few decades, but this recent challenge of high-density leaf cell design has not received the same attention by the design automation community. See, for example, S. R. Nassif and K. J. Nowka, "Physical design challenges beyond the 22 nm node," Int. Symp. Phys. Des. (2010).

A similar scenario is seen with the Design Rule Development (DRD) in integrated circuit manufacturing fabrication process, where design and process steps need to be analyzed and formulated interactively to achieve best mutual gains. DRD process defines important ground rules for the circuit designer to achieve circuits and devices with best manufacturability and high performance. Any violation of the design rules set by the manufacturer produces a fatal error that makes the product unusable and worthless costing both to the manufacturing and the designer significant value and resource time. Typical design rules are rules about proximities, overlap ratios, intersection coverage of geometrical shapes defining the integrated circuit devices and structures.

During DRD, the correct design margins for each rule type are being explored. Too large margins sacrifice design space, yielding larger chip area and waste wafer usage. Too small margins risk manufacturability and cause lower yields. Hence the DRD process requires fine tuning layout variants to identify patterning breakpoints which can then be translated into design rules. DRD is an increasingly challenging task at today's advanced technology nodes because of the explosion in number and complexity of design rules.

Both scenarios (high density cell design, like SRAM cells, and DRD process) described above currently require many interactive steps, which involve designer modifications followed by layout simulations for printability analysis for margin checks. During this process, designer know-how in modifying the layout to achieve the performance specifications under design constraints is extremely critical. For instance, typical SRAM cell layouts demand high density and robust electrical performance, and therefore, designers are often allowed to utilize non-rectangular, specially permitted design rule-violating shapes to pack as much into a small cell size as is possible. In other words, they are allowed to violate certain design rules by carefully checking the printability and manufacturability requirements with detailed analysis. With tight area constraints, designs must pack the maximum electrical performance with stringent stability requirements, and still honor the manufacturability constraints. This process is highly interactive in nature. Designers often experiment with new layout shapes, make local modifications and test out some new ideas to trade off performance with stability and/or area. Each layout candidate goes through some performance checks and manufacturability assessment that constitute the bulk of the design time.

Thus, improved techniques for layout design would be desirable.

SUMMARY OF THE INVENTION

The present invention provides techniques for generating variants of a circuit layout and evaluating quality of the variants. In one aspect of the invention, a method for generating at least one variant layout for a cell design is provided. The method includes the following steps. At least a first basis layout and a second basis layout are obtained for the cell design, wherein the first basis layout and the second basis layout each comprises a plurality of shapes, each of the shapes being a polygon having a plurality of sides and plurality of vertices. One or more of the shapes in the first basis layout are linked with one or more of the shapes in the second basis layout that represent a common feature of the cell design resulting in a plurality of linked shapes. Starting with either the first basis layout or the second basis layout, a location of the vertices of each of the linked shapes is changed, based on a location of the vertices in the first basis layout and the second basis layout to produce the variant layout for the cell design.

A more complete understanding of the present invention, as well as further features and advantages of the present invention, will be obtained by reference to the following detailed description and drawings.

BRIEF DESCRIPTION OF THE DRAWINGS

FIG. 5 is a table containing layout features that can be used to define the patterning quality of a layout according to an embodiment of the present invention;

FIG. 6 is a table illustrating an exemplary sequence of geometry operations that may be performed for computing the measurement of the features defined in the table in FIG. 5 according to an embodiment of the present invention;

FIG. 7 is a diagram illustrating an exemplary methodology for evaluating printing quality of a variant layout according to an embodiment of the present invention;

FIG. 8 is a diagram illustrating morphing of a marker shape according to an embodiment of the present invention;

DETAILED DESCRIPTION OF PREFERRED EMBODIMENTS

Techniques for automated layout exploration and patterning quality assessment to target the time-consuming layout design process are presented herein. The present techniques permit designers to efficiently generate and explore the quality of many layout candidates based on a few input layouts provided by the designer, with minimal error-prone manual intervention.

The design layout generation method presented herein is inspired by image morphing techniques in signal processing, and hence is referred to as "layout morphing." Simply put, the objective is to transform a source layout to a destination layout by generating a series of intermediate layouts which are variants of the source layout. The present process preserves the correspondence between certain features from the source layout to the destination layout through the morphing, and handles multiple mask levels.

The source and destination layouts are provided by the designer to specify an intermediate design space of interest. The patterning quality of each layout variant so generated (by the present techniques) is evaluated in terms of specific geometrical features on the layout that are relevant for the patterning margin. See below. The geometrical features are defined using measurement markers and measured using efficient shape-level geometrical operations on the measurement markers and simulated on-wafer contours of the layout. Contours are simulated at multiple process points that span the range of expected manufacturing variations and the worst case margin values for each feature define the patterning quality of the layout. Unlike edge-placement error, design rule violations and hotspot counts, these measures of patterning quality are process variation aware and continuously sensitive to design changes. Hence, they are amenable to making tradeoffs in the layout to optimize the density and balance the patterning margin in all parts of the layout.

Figure 1A:
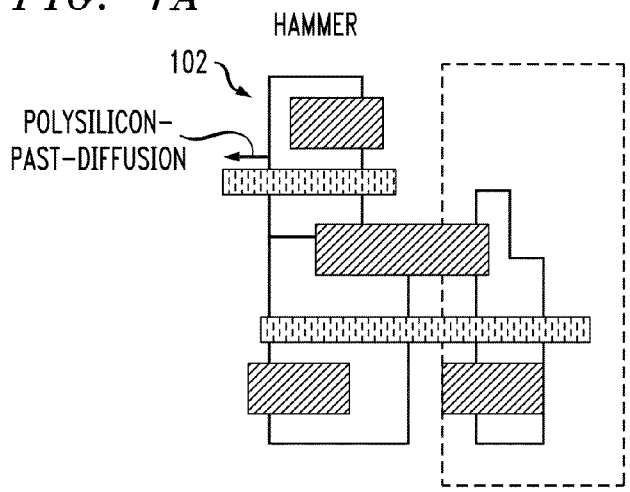
FIG. 1A is a diagram illustrating an exemplary static random access memory (SRAM) cell layout according to an embodiment of the present invention.
Figure 1B:
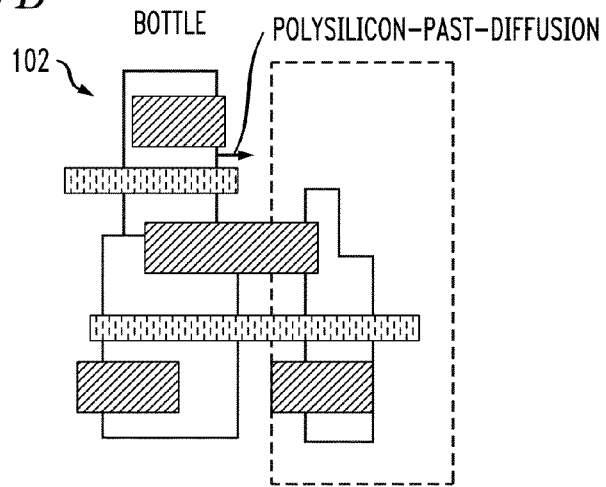
FIG. 1B is a diagram illustrating another exemplary SRAM cell layout which can be created by modifying the layout of FIG. 1A according to an embodiment of the present invention.

The concept of layout morphing is now described. For high-performance critical cells, such as a static random access memory (SRAM) cell, layout is more often an art than science. In the layout design process, designers typically move and modify the device layers forming the active and passive devices, form local polysilicon routes and expand and shrink wiring as well as move contact objects. Designers often modify their layouts using a sequence of simple moves and geometric operations as shown in FIGS. 1A and 1B. The layouts shown in FIGS. 1A and 1B each contain a plurality of shapes. The shapes correspond to features of the layout, such as cell components (e.g., metal contacts, interconnects, etc.). Each of the shapes is associated with a particular layer of the design, wherein a layer denotes some lithographic or other manufacturing step. For instance, the layout might contain shapes corresponding to metal contacts that are formed during the same manufacturing step. Thus, in the layout, these contacts would be located in the same layer. The components belonging to the same layer are given the same shading/hatching pattern in FIGS. 1A and 1B.

By way of example only, the design layout shown in FIG. 1A may be a source layout and the design layout shown in FIG. 1B may be a destination layout, both provided by the designer. Specifically, given the layout of FIG. 1A, the designer can (manually) derive the layout of FIG. 1B and/or one or more other variations of the layout of FIG. 1A by simply moving shapes in the layout and/or changing the dimensions of shapes in the layout. These design techniques are well known in the art. For instance, in the example shown in FIGS. 1A and 1B, the designer might simply move the shape 102 in FIG. 1A to the right to derive the layout of FIG. 1B. Of course, more complex changes are typically implemented in the layout design, however for ease and clarity of description this simple case is being used as an example.

The design layouts shown in FIGS. 1A and 1B are a half-primitive (i.e., a low level cell that is half of the SRAM cell), which would in an actual layout be located in a larger array along with its inverted mirror image simply by replication (i.e., the half-primitive layouts would be replicated in X and Y to make up an array in the chip). The layout shown in FIG. 1A is constrained by a polysilicon-past-diffusion feature on the left (marked with an arrow, see FIG. 1A), while the layout shown in FIG. 1B is constrained by the polysilicon-past-diffusion feature on the right (marked with an arrow, see FIG. 1B). In deep subwavelength lithography, the polygons which make up the design will be printed onto the wafer as curves and there can be an asymmetrical tradeoff (e.g., larger mask shape may not be bigger, or longer shapes on the mask can result in smaller printings on the wafer at the same amount) between the on-wafer (post-lithography simulation) values of these features moving from the L-shaped (hammer) diffusion in FIG. 1A to the T-shaped (bottle) diffusion in FIG. 1B. Thus, the designer may want to search for an intermediate layout that optimally balances the device properties based on the dimensions captured by the litho-simulation. To do so manually, using conventional techniques would be a difficult task, especially when multiple moves and geometric operations are performed on multiple layouts. For instance, it would be very difficult and extremely time consuming to manually decipher and evaluate all possible incremental movements in and/or changes to multiple shapes in multiple layouts.

Thus, techniques are proposed herein to efficiently and automatically generate these intermediate design layouts by transitioning from one layout to another using techniques inspired by image morphing. See, for example, T. Beier and S. Neely, "Feature-based image metamorphosis," *SIGGRAPH* (1992), the contents of which are incorporated by reference herein. Namely, the designer provides one or more possible layouts, such as those shown in FIGS. 1A and 1B (e.g., a source layout and a destination layout), which specify an intermediate design space of interest. The present techniques are then employed to generate one or more intermediate layouts based on the layouts provided by the designer.

The concept of morphing of layout shapes according to the present techniques is now described. Any cell layout is generally defined by a set of rectilinear shapes (i.e., shapes characterized by straight lines) drawn on some specified layers of the layout, where each layer denotes some lithographic or other manufacturing step (see above) and each shape has positional coordinates with respect to a chosen cell origin. A cell origin location for a design layout is a reference point. Everything around it will be measured based on a distance to the origin. With the present techniques, layout alternatives (i.e., intermediate layouts) share the same origin for consistency. The origin is a reference like page 0, x=0, y=0 point on the layout editor. In the layout exploration problem presented herein, a pre-specified set of layouts (for example at least one source layout and at least one destination layout given by the designer) is used as the basis to generate new layout candidates for the cell. The pre-specified set of layouts will be referred to herein as "basis" layouts (as they provide a basis for an intermediate design space of interest) and the newly generated layouts will be referred to herein as "layout variants."

A key requirement imposed by the present morphing techniques on the basis lay-outs is that there should be a one-to-one mapping between the shapes in the basis layouts. Basically, the basis layouts all contain the same number of shapes thus enabling a direct one-to-one mapping between the layouts. As described below, when basis layouts are present that have a different number of shapes, then the designer has to exclude shapes that are specific to a certain basis layout that will not exist in the intermediate layout variants in order to perform the present techniques. One-to-one mapping preserves functionality and logical functional equivalence of the design. The designed circuitry contains the same devices and performs the same logic function. This is done by drawing the same number of shapes to represent the devices.

One-to-one mapping between the shapes in the basis layouts means that each layout variant has the same number of shapes defining similar device structures. For example, if there are two layout variants (e.g., Layout 1 and Layout 2) each having five rectangles, then it is important to determine which rectangle in Layout 1 corresponds to a given rectangle in Layout 2. This correlation provides the relation between the shapes. Basically, the basis layouts and the layout variants as well all contain the same number of shapes, thus enabling a direct one-to-one mapping between the layouts.

Taking the layouts of FIGS. 1A and 1B as an example, each layout contains 10 rectilinear shapes. While the positioning and or geometry of the shapes might vary between the layouts, the number of shapes does not change. Thus each shape can be mapped between the layouts. For instance, shape 102 can be mapped from the layout shown in FIG. 1A to the layout shown in FIG. 1B.

Figure 2:
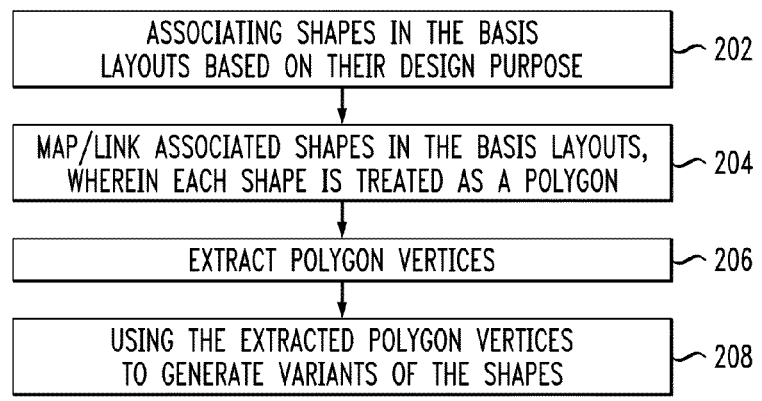
FIG. 2 is a diagram illustrating an exemplary methodology for layout variant generation according to an embodiment of the present invention.

The process for layout variant generation is now described by way of reference to FIG. 2. Specifically, FIG. 2 is a diagram illustrating an exemplary methodology 200 for generating layout variants. To illustrate the process, the example of two basis layouts, such as the basis layouts presented in FIGS. 1A and 1B is used. As highlighted above, the layout shown in FIG. 1A may be a source layout and the layout shown in FIG. 1B may be a destination layout, both provided by a designer. As also highlighted above, the designer may (manually) derive the destination layout from the basis layout using conventional design techniques. For example, in the simple case illustrated in FIGS. 1A and 1B, the designer has simply moved shape 102 to the right (i.e., going from the layout in FIG. 1A to the layout in FIG. 1B). These (source and destination) layouts serve as the starting point for methodology 200.

Let $\alpha \in [0,1]$ be a real-valued morphing parameter, to be used to transition from one basis layout (given by $\alpha=0$) to another (given by $\alpha=1$). The procedure to generate layout variants corresponding to values of $\alpha$ in $[0,1]$, these layouts being referred to as $\alpha$-variants, is now described. In practice, basis layouts contain geometrical shapes placed to provide certain electrical behavior. By way of example only, a metal contact may be represented in the layout by a square placed in a certain (metal) layer of the design and its connecting wires may be represented by rectangles placed in other (metal) layers of the design.

Each design layout contains a multitude of these shapes. Each shape has a known geometry and properties that contain important information (such as information about the layer of the design in which the shape is placed) that will be used in the subsequent production steps. Namely, the shapes in a layout have some properties or information about what the shapes represent. For instance, the layout may be thought of as a mask and the particular shapes present (in the mask) might indicate what device processing steps the shapes are going to be used for. Shape type, e.g., rectangle, square, etc. thus provide valuable information. In the basis layouts the design functionality is the same. As highlighted above, the layout variants have the same shapes with various geometrical differences that result in area-performance-cost tradeoffs. For example, one basis layout may be very dense but lacks electrical performance, while another basis layout may be sparse but has better electrical performance. Here the trade-off is area versus electrical performance. Therefore, in this instance, the designer tries to get as dense a layout as possible while still having an acceptable level of performance, and vice versa, which can be a difficult task.

To begin the process, in step 202, associations are made between the shapes in the basis layouts. Specifically, in step 202, associations are made between the shapes in the basis layouts that perform the same design purpose. According to an exemplary embodiment, the association between shapes is made by attaching a property to each shape in each of the basis layouts indicating the relative ordering of the shape, i.e., a shape rank value. Shape rank value is being used herein for ordering shapes, and generally does not signify an importance or hierarchy of shapes. Shape rank value is primarily just an order number used to match shapes from one Layout to another. The shapes in the basis layouts that share the same shape rank value are then associated, meaning that they are related to each other, their design purposes are the same and they function for a certain role in the design. Associated shapes may be different in size and/or geometrical shape (e.g., square, rectangle, etc.), but their underlying role in the design is the same. Most likely many of the shapes will be identical (i.e., same size and geometrical shape) in the basis layouts and some critical shapes at some layers might be different where the designer wanted to explore the design space. Hence in this step the designer provides the shape rank values to the design shapes. It is notable that since the shape rank values are assigned by the designer, certain factors such as designer intent may be taken into account in assigning the shape rank values. Designer intent includes information the designer knows about the design. For instance, the designer might know the process weak points, major objectives out of multiple objectives and can assign ranks accordingly.

The present concept of associating shapes may be further illustrated by way of reference to the following simple, non-limiting example. Say that there are two layouts, Layout 0 (L0) and Layout 1 (L1), having shapes N0, N1, N2 and M0, M1, M2, respectively. The shapes in each layout are represented by the following information, Format Shape ID: Shape Layer: Shape Rank: Shape Geometry. Thus, if L0 (Layout 0) has the following:

N0: Poly: 1: 10×10–20×20
N1: Poly: 2: 200×200–210×200
N2: RX: 3: 100×100–200×200 and if L1 (Layout 1) has the following:

M0: Poly: 2: 300×300–310×300
M1: Poly: 1: 20×20–30×30
M3: RX: 3: 90×90–210×210, since N0 and M1 have the same shape rank values, then they are associated. The same is true for N1 and M0. For the RX layer, M3 and N2 are associated based on these shapes sharing the same shape rank values. They are for the same purpose functionally.

As will be described in detail below, typical layout implementations have a coordinate system with a pre-defined origin. Thus, representing shape geometry as for example 10×10–20×20 (see description of shape N0, above) indicates that shape N0 is a rectangle with a lower left corner at (10,10) in the coordinate system and an upper right corner at (20,20) in the coordinate system. However, as will be described below, shape geometry also can be defined based on polygon vertices (and still arrive at the same shape). One of ordinary skill in the art, given the present teachings, would know how to implement a coordinate system with a pre-defined origin and represent the design shapes using that coordinate system (using one of the methods provided herein).

In step 204, associated shapes in the basis layouts are mapped to one another. For example, if the two basis layouts provided above Layout 0 (L0) and Layout 1 (L1) contain design shapes N10 and M20 respectively, representing a certain metal contact. Since N10 and M20 represent the same metal contact (i.e., a metal contact performing the same design function in both basis layouts) then N10 and M20 need to be associated. The shape ranks of N10 and M20 should be identical for the rest of the methodology. This association is needed because layout morphing will transform N10 shape into M20 to generate intermediate layout variants. This step basically serves to link (map) shapes within the basis layouts that represent the same feature. From the previous step, the designer assigned ranks for each shape in the basis layouts. Hence this mapping is relatively trivial using the same ranks for shapes from different basis layouts. In the case of basis layouts with a common number of shapes, this association is trivially done by pairing shapes sharing the same rank.

For basis layouts with a different number of shapes, the designer has to exclude shapes that are specific to a certain basis layout that will not exist in the intermediate layout variants. Hence these shapes should be removed from the design layout in order to allow the present layout morphing technique to operate. For instance, using the example provided above, if in Layout 0 there is another shape that is useful for design purposes, but does not have any counterpart in Layout 1, for example:

N3: DEBUGLayer: 0×0–1000×1000

This shape N3 would be removed/ignored. Namely, sometimes design tools need layers to use in verification. It may not be a physical layer, but only included in the design as an informational guide for the tool. A DEBUGLayer is such a layer. This layer does not have any material presence, but it tells the design methodology something specific. This is one way to preserve information in the design layout description.

Now that the shapes are ranked in the basis layouts, and shapes from the different basis layouts are linked since they perform the same purpose and carry the same functionality with potentially different geometrical properties, the remainder of the process can be performed. Here, all of the shapes are treated as rectilinear polygons, which is a common practice in the integrated circuit design field. A rectangle is a specific implementation and is covered by the rectilinear polygon definition. An assumption being made here is that the basis layouts and the shapes defined in the basis layouts are also rectilinear polygons to start with, which is a very valid assumption. The intermediate layout variants between the basis layouts will also need to include shapes drawn as rectilinear polygons. Hence in the next steps the description will focus on how intermediate layout variants and their shapes are defined.

As described above, each shape in the layouts is treated as a rectilinear polygon, or hereinafter simply "polygon." A polygon is composed of a sequence of straight line segments or edges, and points where two edges meet are called vertices. In step 206, the polygon vertices are extracted for each shape mapped/linked in step 204. In a design layout, extracting the polygon vertices simply involves looking up the geometrical properties of the shapes in the design environment (i.e., extracting the shape geometries). For example, typical layout implementations have a coordinate system with a pre-defined origin (for instance lower left corner), and all the shape coordinates are simply properties of the shapes. For rectangle design shapes, simple math can be done to extract the vertices. Using the example provided above, the geometry of shape N0 is defined as 10×10–20×20, i.e., a rectangle with a lower left corner at (10,10) and an upper right corner at (20,20). Alternatively, shape N0 could also be defined as a list of polygon vertices (10,10)-(10,20)-(20,20)-(20,10), or (20,20)-(20,10)-(10,10)-(10,20), or (10,20)-(20,20)-(20,10)-(20,10). These all draw the same rectangle, but just describe it in different formats. Thus, step 206 involves looking up the associated shapes and extracting the same ordering of the vertices to be consistent. It is notable that the designs are rectilinear. Therefore, all of the shapes involved have rectangles or rectilinear polygons.

At this stage, the designer needs to provide input to the flow by associating the vertices of a shape (polygon) (extracted in step 206) from one basis layout to another. This information is needed to translate the shape from one basis layout to another using a transformation operated on all of the vertices. Using the example provided above, transformation on all vertices is moving from Layout 0 (L0) to Layout 1 (L1), i.e., the source layout and destination layout, respectively. For example, N0 will be transformed into M1 (since, in the example, L0 and M1 have the same rank, see above):

| Layout 0 | Layout 1 |
|---|---|
| N0: 10x10-20x20 | M1: 20x20-30x30 |

To perform the transformation from N0 into M1, the N0 shape is moved by 10 pixels north and 10 pixels east to get to shape M1. That transformation is performed on all of the vertices:

Vertex (10,10)→(20,20)
Vertex (10,20)→(20,30)
Vertex (20,10)→(30,20)
Vertex (20,20)→(30,30)

The transformation is dependent on a parameter ($\alpha$) which is swept from 0 to 1. In this example, the value of $\alpha/10$ was added to each vertex X coordinate, and the value of $\alpha/10$ was added to each vertex Y coordinate, i.e., $X(\alpha)=X(N0)+\alpha/10$ and $Y(\alpha)=Y(N0)+\alpha/10$, wherein $X(N0)$ is the x coordinate of the vertex in N0, $Y(N0)$ is the y coordinate of the vertex in N0, $X(\alpha)$ is the x coordinate of the vertex in the morphed layout using the value $\alpha$ and $Y(\alpha)$ is the Y coordinate of the vertex in the morphed layout using the value $\alpha$. The corner case $\alpha=0$ corresponds to the source layout and $\alpha=1$ relates to the destination layout. The designer is free to choose any $\alpha$ between (0,1) to explore the design space.

Thus, if for example the two basis layouts (source layout and destination layout) contain n number of shapes, it may be the case that a certain number of the shapes are the same in both of the basis layouts (i.e., they have the same coordinates, thus resulting in the same location in the layout and the same shape geometry). As provided herein, shape geometry refers to geometric characteristics of the shape, such as size, shape (e.g., square, rectangle), etc. Accordingly, while the steps of the present methodology might be performed on these shapes, in effect no morphing will occur with these shapes that are the same in both layouts. However, with the shapes that are different in the basis layouts (i.e., the shapes that have different coordinates, thus resulting in a different location in the layout and/or shape geometry), morphing will be performed on all of the vertices of these shapes in accordance with the chosen morphing parameter ($\alpha$). Since, as will be described in detail below, the morphing parameter has extreme values 0 and 1 which correspond to the provided basis layouts, the starting and ending location points for the vertices of the morphed/changed shapes will be dependent on their locations in the source and destination layouts. Thus, incremental changes are made between the source and destination layouts based on the morphing parameter to generate the variant layouts. As described herein, for efficiency sake, the layout morphing techniques may be performed only for those shapes that are different in the basis layouts, thus preserving valuable processing resources and time.

The designer is allowed to associate any point on the periphery of a shape in one basis layout to any point on the periphery of a shape in the other basis layout to perform the association, i.e., the associated points on the polygon periphery can be on edges or on vertices. These points are referred to generally as 'periphery nodes.' Thus, as will be described in detail below, the vertex mapping is not limited to vertex nodes.

Figure 3A:
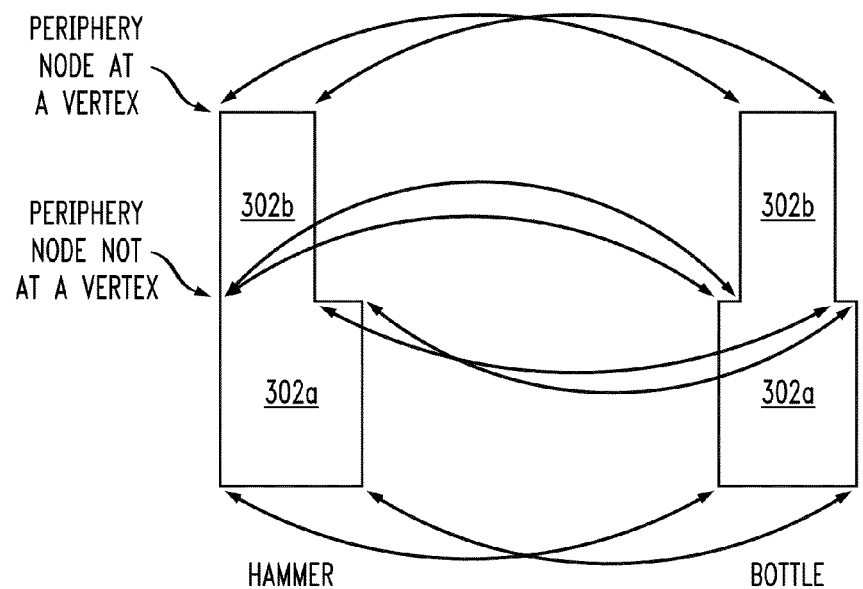
FIG. 3A is a diagram illustrating vertex mapping for a simple case where the layouts of FIGS. 1A and 1B are given as basis layouts according to an embodiment of the present invention.
Figure 3B:
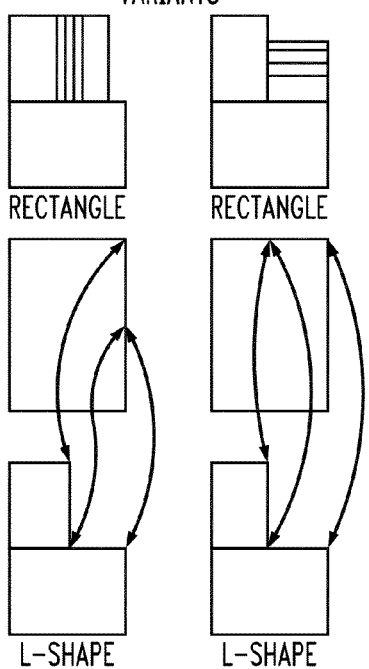
FIG. 3B is a diagram illustrating vertex mapping for a complex case involving morphing from a rectangle to an L shape wherein the number of vertices is different according to an embodiment of the present invention.

FIG. 3A, for example, depicts an example of vertex association between hammer and bottle shapes in two different basis layouts. Notice all the vertices in one layout are linked to a vertex on the other layout, or to a periphery node. Different vertex associations may lead to different layout variant generations as shown in FIG. 3B. The variants shown at the top of FIG. 3B are generated by different associations of the vertices of the L-shape and the bottom rectangle. This shows why vertex associations are also important and cannot be done automatically without designer help.

Now that the shapes in each layout have been sorted, associations between the shapes have been made and vertex associations have been made, intermediate shapes for the layout variant can now be generated. In step 208, the extracted polygon vertices are used to generate variant shapes. Specifically, for each layer L, a "morphed" $\alpha$-variant shape is generated for each associated shape s by linearly combining the vertices with $\alpha$, and $1-\alpha$ weightings. See example above. This is done simply by a linear combination operation. For example, the associated lower left coordinate (location of a vertex node) of two associated rectangles from the basis layout $\alpha=0$ (i.e., $x_{LL}(0)$) and that of the basis layout $\alpha=1(x_{LL}(1))$, can be mixed to compute the lower left coordinate (location of a vertex node) of the $\alpha$-variant rectangle as $x_{LL}(\alpha)=(1-\alpha)x_{LL}(0)+\alpha x_{LL}(1)$. As described above, $\alpha$ is the morphing parameter and its extreme values 0 and 1 correspond to the provided basis layouts. According to an exemplary embodiment, the location of at least one of the vertices of at least one of the shapes is changed at each iteration of the process to produce a variant cell layout.

An $\alpha$-variant layout will contain $\alpha$-variants of all shapes identified in the basis layouts, each variant shape generated using the proper weightings on its basis layout versions. If the basis layouts do not have dramatically different organization of the shapes, this will preserve the interactions between shapes and layers in the layout variants, such as connectivity, separation and geometrical requirements stemming from the basis layouts.

In a more efficient implementation, the shapes that are identical across the basis layouts (i.e., common to all basis layouts), can simply be directly copied to the $\alpha$-variant layout, since combining identical shapes is trivial (results in the same shape itself). The computational complexity of layout variant generation depends on the number of distinct shapes (having different geometrical properties and coordinates) in the basis layouts. It is required that the designer provides input on the ranks for each shape, and association of the vertices as described above. This input requisition can be done on a text file, written in a pre-defined language. It can also be done interactively in a graphical design environment interface by simple mouse clicks and relevant data entry (by the designer).

The layout variant generation described above is a simple and efficient way of generating many layout candidates. The number of layout variants is a designer option, meaning he/she can control how many samples of morphing parameters to be used in the flow. Typically tens of layout variants can be generated very efficiently for manual inspection, but fully automated flows can generate as many layout variants as needed.

For m>2 basis layouts, the procedure can be applied incrementally extending the morphing parameter α, to a set of morphing parameters $(\alpha_1, \ldots, \alpha_m)$. Any layout variant can then be generated by taking convex linear combinations of the basis layout vertices as:

$$x = \sum_{i=1}^{m} a_i x_i, \quad s.t. \sum_{i=1}^{m} a_i = 1, \quad a_i \in [0, 1] \forall i. \tag{1}$$

For the aforementioned procedure containing two basis layouts, it can be deduced that $\alpha_1 = (1-\alpha)$ and $\alpha_2 = \alpha$. By way of example only, if m=3, then there are 3 layouts (e.g., Layout 0 (L0), Layout 1 (L1) and Layout 2 (L2)). In these 3 layouts, say for instance that shapes N0, M1 and P1 (respectively) share the same shape rank, and thus are associated:

Layout 0, N0 10×10−20×20→vertices are (10,10)-(10,20)-(20,20)-(20,10)

Layout 1, M1 20×20−30×30→vertices are (20,20)-(20,30)-(30,30)-(30,20)

Layout 2, P1 25×25−35×35→vertices are (25,25)-(25,35)-(35,35)-(35,25).

To morph the shapes, an α__1, α__2 and α__3 are used that satisfy Equation 1, i.e., the sum of α__1, α__2 and α__3 is 1 and each of α__1, α__2 and α__3 is between [0,1]. Using any α__1, α__2 and α__3 the new vertices of the morphed layout can be found using Equation 1:

X(α__1,α__2,α__3) of the first vertex=10*α__1+ 20*α__2+25*α__3

Y(α__1,α__2,α__3) of the first vertex=10*α1+20*α__ 2+25*α__3.

Implementation details of the present process are now described. FIG. 3A illustrates vertex mapping for a simple case using the layouts of FIGS. 1A and 1B as basis layouts, where all shapes except for the L- or T-shaped diffusion are identical across the two basis layouts. The vertex mapping is automatically generated since the vertex count stays the same for both rectangles. The arrows in FIG. 3A indicate mapped vertices (i.e., wherein the vertices connected by an arrow are mapped to one another). As highlighted above, the vertex mapping can include any point on the periphery of a polygon, not just vertex nodes. FIG. 3A illustrates periphery nodes used for vertex mapping, some of which are not located at a vertex node. Specifically, FIG. 3A illustrates the morphing of a hammer or L-shaped diffusion to a bottle or T-shaped diffusion. It is notable that the L-shaped diffusion in the layout is actually composed of two separate shapes (polygons) 302a and 302b. Morphing of the L-shaped diffusion to the T-shaped diffusion in this example simply involves moving the positioning of the polygons 302a and 302b relative to one another. Thus, the T-shaped diffusion is also composed of the polygons 302a and 302b.

By contrast, FIG. 3B, shows a more complex case where it is desirable to morph from a rectangle in one basis layout to an L shape in the other basis layout. Here the vertex counts are different (4 vertices in the case of a rectangle and 6 vertices in the case of an L shape). Two different and valid vertex mappings are shown where two vertices of the L-shape are mapped to a point on either the right border or the top border of the rectangle. Some intermediate a-variants for each mapping are shown at the top of FIG. 3B. Of course, what is shown in FIG. 3B is just a schematic representation of a number of different variants that might be produced using the present process. In actuality, all of the intermediate variants produced would go into separate layout drawings so that potentially hundreds of different layouts in different output files could be produced.

As FIG. 3B clearly shows, for the same basis shapes, different vertex mappings can give completely different morphed variants when the vertex counts are different. In such cases, the user/designer can specify the exact vertex mapping that is desired, depending on the type of morphing that is of interest. Thus, in this case, some user input is desired.

It has been shown that automatic shape mapping is feasible for most design cases especially for advanced technology nodes, since the interesting layout topologies are quite restricted for any specific schematic. For example, SRAM bitcells now typically have the thincell (see, for example, K. Nii et al., "A 90 nm dual-port SRAM with 2.04 m² 8T-thin cell using dynamically-controlled column bias scheme," *Int. Solid State Circ. Conf* (2004), the contents of which are incorporated by reference herein) topology and restricted design rules which, coupled with diffusion sharing and wirelength objectives, strongly restrict the layout topology space for other dense cells. Furthermore, for hierarchical layouts, such as arrays, bit-slices and the like, the layout variant generation may operate on the leaf cells without increasing the computational complexity.

Given any layout variant, it is desirable to evaluate the variant quality in some context, for example, the number of design rules violated, the electrical performance of the on-wafer non-rectangular transistors and wires (see, for example, A. Bansal et al., "Yield estimation of SRAM circuits using 'Virtual SRAM Fab'," ICCAD (2009) (hereinafter "Bansal"), the contents of which are incorporated by reference herein) or the geometrical patterning quality for the available process capabilities. For the purpose of high-density layouts, the most relevant quality measure is the patterning quality, followed by electrical performance, which has seen much research recently, such as in Bansal. The focus herein is on the patterning quality.

Patterning quality is now described. Process capabilities are typically captured as a set of parameters that are consumed by a lithography simulator (see, for example, C.A. Mack, "Thirty years of lithography simulation," SPIE, 5754 (2004) (hereinafter "Mack"), the contents of which are incorporated by reference herein), for example defocus, intensity, mask error and etch bias. The patterning quality can be defined in many ways, depending on the application. In standard physical design, the quality may be defined by the number and severity of design rule violations. This is not relevant herein since it is the intent to either push layout density beyond the conservativeness of design rules, or to try to develop the design rules themselves.

In optical proximity correction, the quality is typically defined using edge placement error (EPE). See, for example, N. Cobb, "Fast optical and process proximity correction algorithms for integrated circuit manufacturing," Ph.D. Thesis, U. California, Berkeley (1998), the contents of which are incorporated by reference herein. EPE, however, is typically defined for a particular process condition and cannot be easily generalized to process windows.

Another quality metric that has been used for layout printability assessment is hotspot count. A hotspot is any location on a layout that fails a certain printing check, such as a bridging or minimum margin check. Hotspot count, however, is not a useful metric for this design application since it is not continuously sensitive to changes in the layout. For example, moving a particular feature by a small 2 nm may not change the number of hotspots, even if the patterning margin of the design improves. In fact, hotspot counts tend to be a strong function of the hotspot detection method. For instance, a single non-rectangular hotspot region may get detected as multiple abutting hotspots. As a result, the number of hotspots can be inconsistent with the patterning margin for small layout changes, i.e., one may find more hotspots even if the patterning is improved.

Thus, quality measures are needed that take the process window into account, are design-aware and are continuously sensitive to layout changes. To satisfy this need, the concept of measurement markers can be used. Using measurement markers, features (e.g., distances, overlap areas, etc.) that are relevant to the design and are real-valued can be specified. The post-simulation values of these features are real-valued and satisfy the requirements for good quality measure.

Measurement markers are now described by way of reference to FIGS. 4A-E and FIG. 5. FIGS. 4A-E illustrate quality defining feature types, wherein shaded regions with dashed boundaries are simulated contours and white shapes with solid boundaries are drawn shapes. Simulated contours are what are actually printed on the wafer. For example, the layout may be thought of as a mask. Normally, light passes through the mask onto the wafer and gets chemical reaction. Therefore the actual shape (say rectangular) does not appear the same on the wafer. Instead its image (image contour) gets imprinted on the wafer. Simulated contours predict what the image on the wafer will be, given the mask and the process models.

As described above, according to the present techniques, the drawn shapes are represented as polygons. The designations L1 and L2, for example, correspond to a drawn shape on layer 1 and a drawn shape on layer 2, respectively. The measurement markers specify either one- or two-dimensional geometric features on the layout. For example, if gate-contact distance at a specific location is a relevant feature, a corresponding "distance" measurement marker would be a line segment intersecting the edges of the gate and contact shapes. See for example FIG. 4A where in this example shape L1 corresponds to a gate and shape L2 corresponds to a contact. The relevant feature here is the post-simulation contour distance and not the drawn distance. This is because the designer wants to learn about the distances on the actual wafer not at the mask where he/she knows all the details. The image transferred to the wafer is not trivial to the designer. This distance measurement marker is labeled "DIST_L1_L2." If simulations were run for different expected process conditions (e.g., across the process window), one would obtain a distribution of values for this distance. A useful quality measure could then be the minimum value of the distance.

Figure 4A:
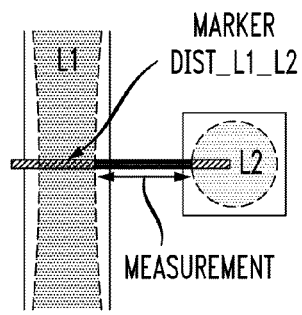
FIG. 4A is a diagram illustrating a distance measurement marker according to an embodiment of the present invention.
Figure 4B:
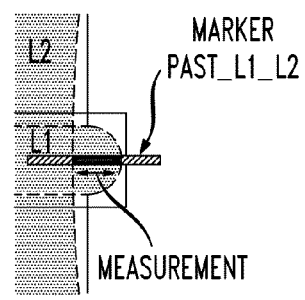
FIG. 4B is a diagram illustrating a past measurement marker according to an embodiment of the present invention.
Figure 4C:
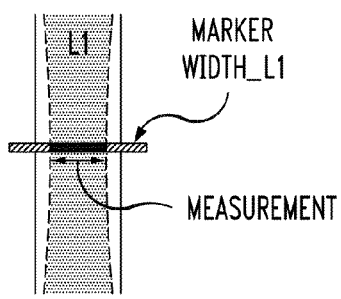
FIG. 4C is a diagram illustrating a width measurement marker according to an embodiment of the present invention.
Figure 4D:
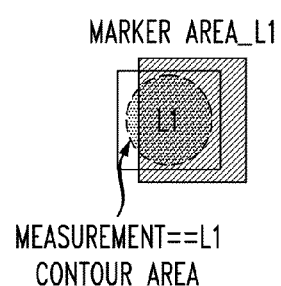
FIG. 4D is a diagram illustrating an area measurement marker according to an embodiment of the present invention.
Figure 4E:
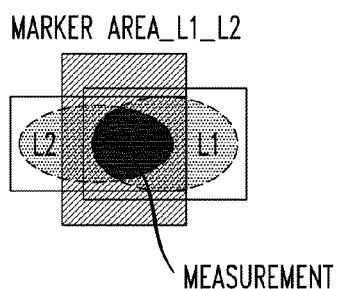
FIG. 4E is a diagram illustrating an overlap measurement marker according to an embodiment of the present invention.

FIG. 4B illustrates the measurement marker past which is representative of an overhang of a shape on L1 beyond a shape on L2. This past measurement marker is labeled "PAST L1_L2." A past-marker is for extensions beyond the shape boundaries. Namely, there are minimum requirements for certain shapes that need to go at a minimum beyond a perpendicular line for completion. FIG. 4C illustrates the measurement marker width which is representative of the width of a shape on L1. This width measurement marker is labeled "WIDTH_L1." FIG. 4D illustrates the measurement marker area which is representative of an area of a shape on L1. This area measurement marker is labeled "AREA_L1." FIG. 4E illustrates the measurement marker overlap area which is representative of an overlap area of a shape on L1 and a shape on L2. This overlap area measurement marker is labeled "AREAL_L1_L2." These measurement markers represent layout features that can be used to define the patterning quality of a layout, and are summarized in the table shown in FIG. 5. The designations L1 and L2 can be replaced with any drawn layer name.

The features defined in FIG. 5 and illustrated in FIGS. 4A-E cover all scenarios that have been found relevant to current state-of-the-art integrated circuit design. As used herein, the term "shape," as described above, refers to the polygon provided by the designer for the mask so that its image transferred onto the wafer performs a meaningful function, such as makes a transistor, acts like a resistor, wire etc. The term "marker" refers to a shape/line provided by the designer for a design tool (software) to analyze certain geometric aspects of the layout, such as distance to a point, area of a shape, etc. Its intent is not in the actual hardware but to be processed by a design tool to provide insight/analysis during the design stages. The term "features" refers to aspects of a shape which are generally measured by a marker, such as one-dimensional features: distance, past extension, minimum distance, etc., two-dimensional features: area, coverage percent, etc.

At the time of drawing the layout (an early design stage) these features can be defined by the user using measurement markers. A format and tool-agnostic measurement marker can be a design shape (also referred to herein as a "marker shape") on a specially named layer, where the layer name and the position define the feature to be measured. The marker shapes provide information consumed by the design tools only (that is the purpose of the marker shapes) and this information does not propagate to manufacturing layers. Thus, the marker shapes can be thought of as assisting shapes for design verification. The marker shapes can be thought of as a line or a rectangle as provided in the example. The one-dimensional feature (DIST, PAST) marker shape can be a rectangle with a width=1 so that the area of the measured feature is equal to the length of the rectangle. One-dimensional features need to be unit-width. Two-dimensional feature marker shapes can be a rectangle of any width/length. The use of rectangle marker shapes for both one- and two-dimensional features is however merely just an example. The special layer names can be the same as the mnemonics in the table of FIG. 5. An optional tag (<t>) can be added to any mnemonic to differentiate two independent features of the same type (e.g., DIST_L1_L2_nfet and DIST_L1_L2_pfet).

A marker shape has to satisfy certain constraints to properly define the given feature. According to an exemplary embodiment, for one-dimensional features, the marker shape constraints are as follows: first, as described above, the marker shape must be a rectangle of width 1. Second, the rectangle must have a length sufficient to intersect the relevant edges of the post-simulation contours. For instance, if the distance between two shapes is of interest and if a marker layer is placed just abutting these two shapes, then there is chance that the marker shape might not cover both of the simulated contours (if for example the simulated contours shrink as compared to the layout). In that case, the marker layer is not useful. Thus, in practice it is best to place a marker shape that is marginally larger than the actual shape since the expected simulated contours are smaller than the actual layout shape. Third, the rectangle must not define more than one feature. For example, a gate-contact distance marker should not be so long as to go beyond the contact and intersect with a neighboring gate shape. See, for example, FIG. 4A.

According to an exemplary embodiment for two-dimensional features, we will look for an area coverage of an intersection of two design layers (e.g., CA and M1 layers). A marker shape is also used to measure this intersection using the following constraints: First, the marker shape must touch the drawn shape(s) of which the area has to be measured (CA and M1 layers). Second, the marker shape must be positioned to touch the post-simulation feature (contour or overlap area) that has to be measured. This is easily accomplished by making the marker shape large and placing it to intersect with the intended intersection. The marker must not intersect other drawn shapes that are not relevant to its specific feature.

Measurement computation is now described. The actual features are measured on post-simulation contours as defined by the measurement markers. This measurement is performed using some sequence of geometry operations on the markers and the contours. FIG. 6 is a table illustrating an exemplary sequence of geometry operations that may be performed for computing the measurement of the features defined in the table in FIG. 5. In FIG. 6, M is the measurement marker, L1 and L2 denote the contour layers that are being measured, MMT is the final measurement shape and an area of the final measurement shape is the required measurement. The term "Measurement ops" refers to standard set operations performed on geometrical shapes in the layout. It is common in shape processing and design rule checking to have operators like those listed in FIG. 6. For example A+B means both shapes in layer A or B, A*B refers to all the shapes in both A and B, A-B refers to all shapes in A but not in B.

A brief description of each atomic operator used in FIG. 6 is now provided. The atomic operator '−' denotes a difference operation. 'M1.Touch(L2)' returns M1 if the marker shape touches L2, otherwise it returns null. 'M1.TouchTwice(L1)' returns M1 if the marker shape touches L1 twice, otherwise it returns null. '∩' denotes the intersection operation. These operations are implemented using well known scanline methods in combination with efficient data structures for non-orthogonal shapes. See, for example, P. T. Chapman et al., "The scan line approach to design rules checking: Computational experiences," DAC (1984), U.S. Patent Application No. 2010/0058265 A1, filed by Finkler, entitled "Parallel Intrusion Search in Hierarchical VLSI Designs with Substituting Scan Line," and A. Lvov et al., "Exact Basic Geometric Operations on Arbitrary Angle Polygons Using Only Fixed Size Integer Coordinates," ICCAD (2008), the contents of each of which are incorporated by reference herein. For each marker, the measurement from FIG. 6 results in a measurement shape (denoted by MMT) whose area is the required measure. FIGS. 4A-E, described above, illustrate these measurement shapes. For example, FIG. 4A has a marker shape (shown in DIST_L1_L2 layer) to measure a distance between L1 and L2 layers. L1 is drawn vertically as a rectangle, but its simulated contours are shown in the shaded portion, L2 is drawn as a square but its simulated contour is a circle (as illustrated by the shaded portion). Here there is also a marker shape in the DIST_L1_L2 layer that intersects both L1 and L2 layers with some extension. DIST_L1_L2 is measured as the distance between simulated contours of L1 and L2. FIG. 4B has a PAST measurement and FIG. 4C has a WIDTH measurement. Both FIG. 4D and FIG. 4E have an AREA measurement, wherein FIG. 4D measures a single layer area and FIG. 4E measures the intersection of two layers.

FIG. 7 is a diagram illustrating exemplary methodology 700 for evaluating printing quality of a variant layout. Methodology 700 may be performed on each of the variant layouts/candidate layers generated according to methodology 200 (of FIG. 2, described above). In step 702, for a given one of the variant layouts, features that are relevant for defining the patterning quality of the layout (also referred to herein as "pattern quality defining features") are identified. This process was described in detail above.

In step 704, the drawn variant layout is marked using the measurement markers, as described above, to identify those features that are relevant for defining the patterning quality of the layout. This marking may be done manually for each layout variant, or the markers may be generated along with the layout variant by the morphing method described above. Take for instance, an area measurement AREA_L1 marker shape on a L1 layer square shape which is actually moving with layout morphing. Hence its coordinates are a function of the morphing parameter. In the basis layouts, L1 layer square shapes are different, and if marker shapes AREA_L1 are used properly on both basis layouts, and if morphing is applied on the marker shapes as well, then the result is morphed marker shapes in the layout variants. In other words, measurement shapes are also allowed to be morphed with their respective shapes to make measurement consistent to the actual shape. See, for example, FIG. 8, described below.

In step 706, the drawn layout is taken through patterning simulation under various different process conditions, resulting in simulated layouts. The set of process conditions may be defined by process engineers who characterize and understand the distribution of the process-dependent simulation parameters. For example, one may simulate points along the 3-sigma probability surface in the space of these process-dependent parameters, such as defocus, light intensity, etch bias, etc. See, for example, Mack. In step 708, the feature measurement operations shown in the table of FIG. 6 and described above are then applied to the resulting simulated layouts and the measurement markers. The areas of the resulting measurement shapes (MMT) are the measured feature values. In step 710, the layout patterning quality can then be analyzed using these measured feature values. A typical analysis may be to look at the worst-case values for each relevant feature, for example, the minimum value of some gate-contact distance feature. A high quality layout is one with consistent metrics satisfying minimum requirements (min dist, min area satisfied) and displaying smaller variability. A high variability makes device performance statistically varying and hence reduces yield/profitability.

As highlighted above, the marker shapes can also be morphed using layout morphing. In all basis layouts, the designer could use identical marker shapes, but he/she doesn't have to. If the designer wants to use different size marker shapes, layout morphing (as described herein) can be used to generate α-specific marker shapes for α-generated morphed layouts. Say, for example, a distance is measured by putting a marker shape in DIST_L1_L2 layer as in FIG. 4A. In Layout 0, layers L1 and L2 are separated by 10 micrometers, in Layout 1, layers L1 and L2 are separated by 2 micrometers. In this case, if a marker shape is used, the marker shape has to be about 10-11 micrometers wide to perform proper measurement, however the marker shape would be too large for Layout 1. Therefore, a 10-11 micrometers wide shape could be used in Layout 0, and a 2-3 micrometer wide shape can be used in Layout 1. When generating morphed layouts, separations between L1 and L2 layers will range from 2 micrometers to 10 micrometers. The marker shapes will also be scaled accordingly using the same morphing parameter. See FIG. 8.

As shown in FIG. 8, the separation between layers L1 and L2 is 2.5 micrometers in Layout 0 and 10.5 micrometers in layout 1. However, in the morphed layout, the separation between layers L1 and L2 is 6.5 micrometers. Identical marker shapes cannot be used in this case, since (as described above) the marker shapes in Layout 0 would be too large for Layout 1. Thus, as described above, morphing of the marker shapes can be used to adapt the marker shapes to the new morphed layout.

As described above, marker shapes may be thought of as assistant shapes for design verification. Morphing of the marker shapes permits the marker shapes to adapt to different, new layout environments. Typically multiple groups or teams are involved in the circuit design and manufacturing process. For instance, one team might work on the layout design, another team might work on the design verification and a third team might work on the manufacturing aspects. The teams all use the same design layout file to avoid any data conflicts. Thus, in the layout file, the design team puts shapes to represent devices, process layers and debug layers; the design verification team puts shapes to represent measurement markers, hotspots, areas that display, or may be subject to design errors; the manufacturing team puts manufacturing related information as shapes in the layout file. The layout file is therefore a collection of shapes that contains design information, verification data and manufacturing preparation information. Hence, the layout file is multi-functional, and thus typically very large.

Figure 9:
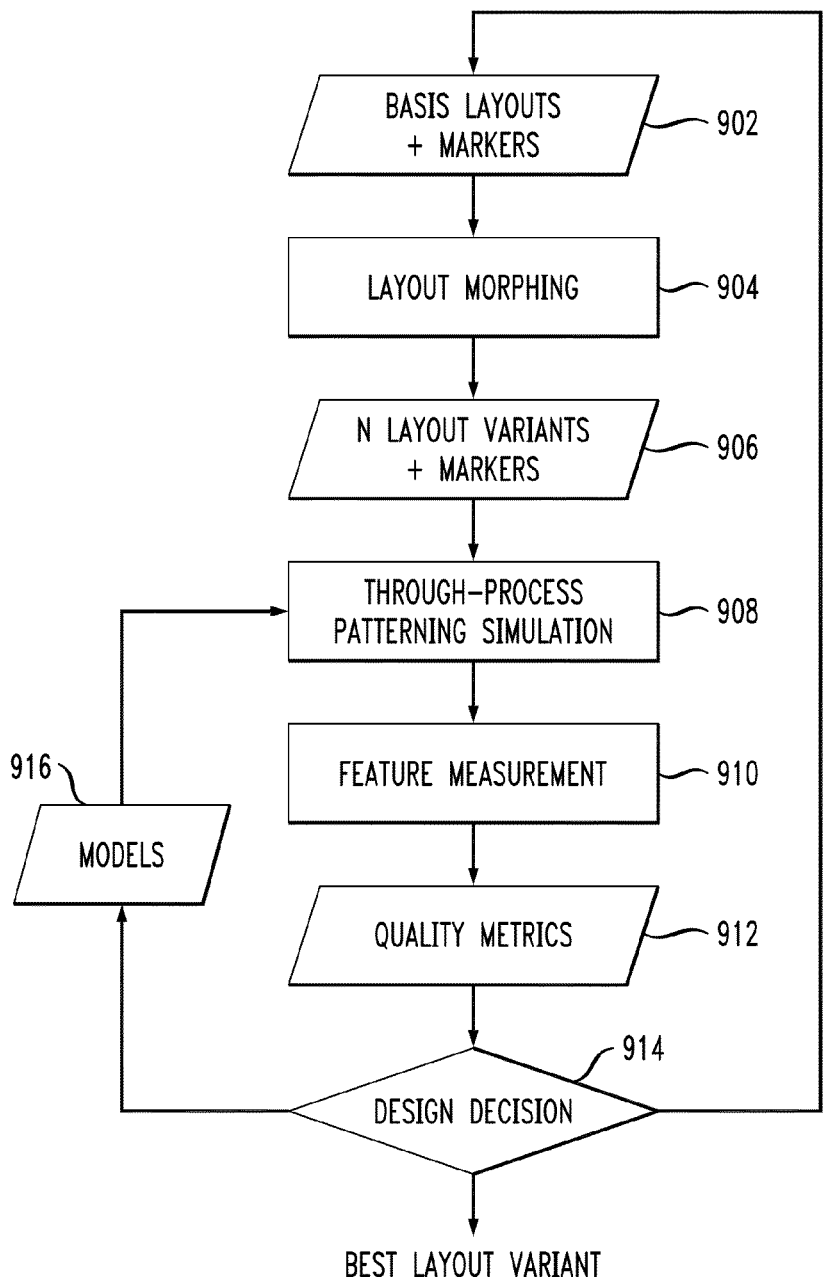
FIG. 9 is a diagram illustrating an exemplary implementation of the present techniques according to an embodiment of the present invention.

The present teachings are further described by way of reference to the following non-limiting example in FIG. 9. The present techniques were implemented using the methodology 900 illustrated in FIG. 9 on an exemplary design. A designer has a single design environment for this framework that allows him or her to generate layout variants and analyze the behavior of the layout quality across these variants, so as to converge on a layout with sufficient patterning margin in terms of all relevant features. The entire infrastructure of patterning simulation, lithography models and shapes engines are invisible to the designer. An exemplary apparatus that may be employed to perform the present techniques is provided in FIG. 13, described below.

Methodology 900 is iterative by nature. The process begins with initial basis layouts including design and marker shape and layers and will be repeated until constraints on pre-defined performance metrics are met. According to methodology 900, in step 902, initial basis layouts are provided. As shown in FIG. 9, there may be measurement markers in these basis layouts. As described above, measurement markers serve as assistant shapes for design verification and can be morphed along with the shapes in the basis layouts. See, for example, description of FIG. 8, above. In step 904, shape morphing was carried out (shape morphing is layout morphing applied on a single shape). The process of shape morphing including treating the shapes as polygons, and using the polygon vertices to generate variant shapes was described for example in conjunction with the description of FIG. 2, above. As described above, measurement markers may also be generated along with the layout variant. As a result, in step 906, N distinct variant layouts were generated by the shape morphing. Features within the variant layouts that are relevant for defining the patterning quality of the layout are identified using the measurement markers. In step 908, pattern simulations, as described above, under various different process conditions were used to produce simulated layouts. In step 910, the feature measurement operations described above were then applied to the resulting simulated layouts and the measurement markers to determine measured feature values. In step 912, the measured feature values were then used to analyze patterning quality. Suitable quality metrics were described above. In step 914, a decision is made. Namely, if the quality metrics were satisfactory for a variant being generated at this iteration, then the iterations may end and the flow can report the best layout variant satisfying the performance constraints. The designer then can take this layout and use it as optimized. If the performance metrics are not satisfactory, then further iterations may be needed to explore layout variants. Therefore the flow can go back to step 902 to re-define basis layouts and re-generate another set of N distinct layout variants for further exploration. Moreover, in step 916, the designer may also choose to update the process models (manufacturability models modeling process capabilities or options available in manufacturing). Therefore a change of process models would optimize the technology side of the manufacturing where it can be used for a better product with the same layout design. The flow in FIG. 9 gives an efficient framework for design and process exploration for high-performance integrated circuits in emerging technologies. Layout morphing using basis layouts and automatic generation of the layout incorporated with the built-in measurement capabilities gives ultimate efficiency.

Figure 10A:
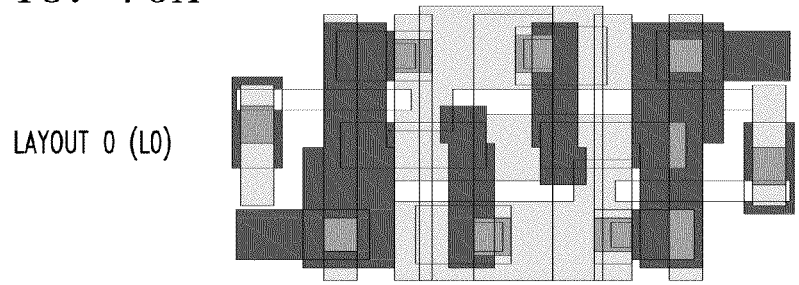
FIG. 10A is a diagram illustrating a relaxed basis layout for use in an exemplary implementation of the present techniques according to an embodiment of the present invention.
Figure 10B:
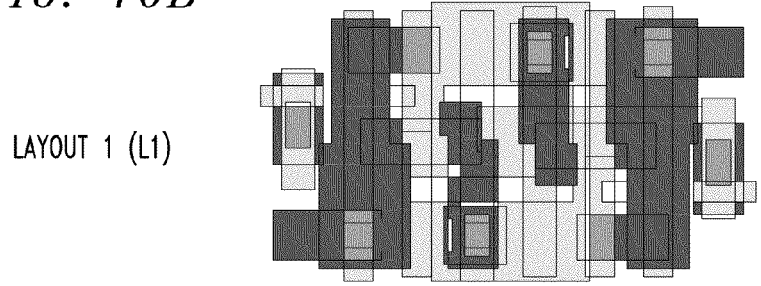
FIG. 10B is a diagram illustrating an extremely dense basis layout for use in an exemplary implementation of the present techniques according to an embodiment of the present invention.

The process flow illustrated in FIG. 9 was applied to the design of an ultra-dense 6-transistor SRAM bitcell in 22 nm technology. Two basis layouts are shown in FIGS. 10A and 10B. The basis layout shown in FIG. 10A is a relaxed layout (L0), meaning it satisfies some performance metrics with an expense of more area and higher power consumption. The basis layout shown in FIG. 10B is an extremely dense layout (L1). It is known in advance that L1 is excessively dense for the process under discussion, but it defines the desirable direction for the layout. Layout L0 is conservative and printable. Thus, the ideal layout will lie somewhere in between these two extremes.

Figure 11:
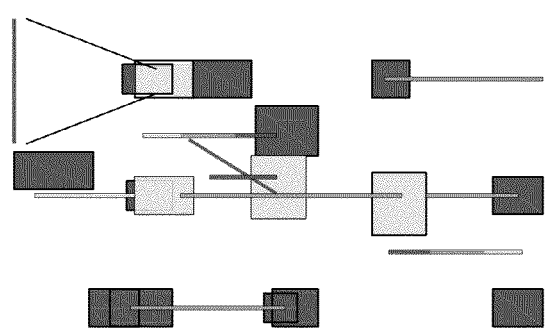
FIG. 11 is a diagram illustrating measurement markers for features in the basis layouts of FIGS. 10A and 10B according to an embodiment of the present invention.

In this example, the layout quality is defined in terms of eight different mask layers, leading to a large set of features that have to be analyzed. FIG. 11 shows the measurement markers (thin bars) for these features. In this example, there are 17 different features which will define the printing quality of the layout. There are a total of 37 measurement markers since multiple markers may be used for the same feature. The layout quality is defined in terms of the minimum value across the markers for each feature. In this example, nine intermediate layout variants are generated by morphing from L0 to L1. Here the number of variants is a designer option, and can be chosen independently. Note that all eight mask layers are morphed simultaneously.

Figure 12A:
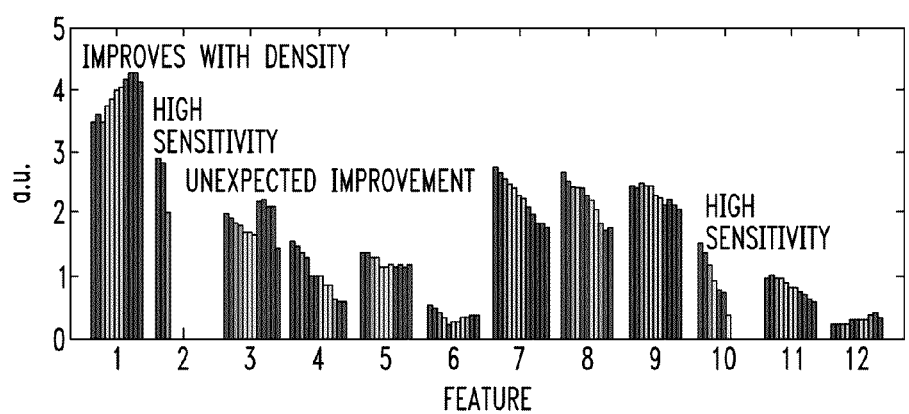
FIG. 12A is a graph illustrating measured minimum values for each one-dimensional feature across 11 layout variants of the basis layouts of FIGS. 10A and 10B according to an embodiment of the present invention.
Figure 12B:
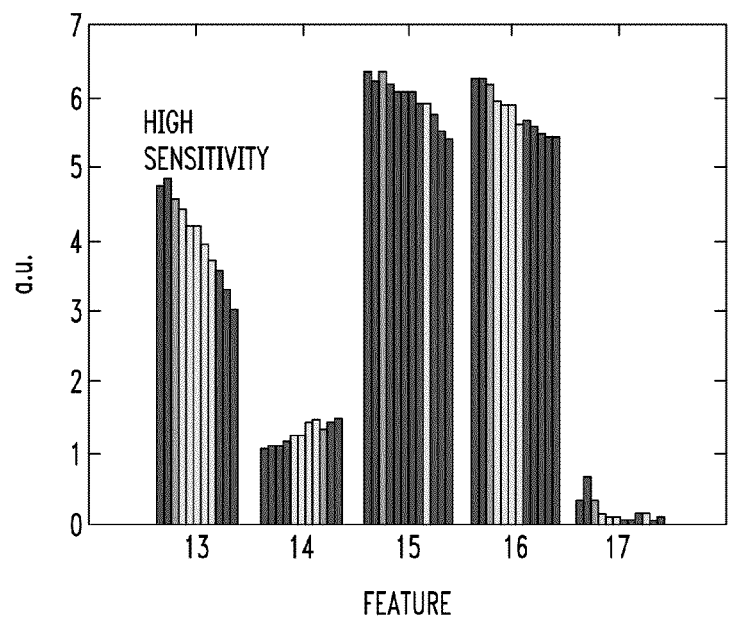
FIG. 12B is a graph illustrating measured minimum values for each two-dimensional feature across 11 layout variants of the basis layouts of FIGS. 10A and 10B according to an embodiment of the present invention.

The layouts are simulated using a lithographic simulation engine at multiple process points on the 3-sigma contour of the process parameter space. Specifically, defocus, light intensity and mask error are varied. Etch bias is taken as a feature-dependent systematic variation. The simulations are performed on a 16×10 array of cells to include proximity effects, and the measurements are made on one of the central cells. FIG. 12A is a layout quality plot illustrating the measured minimum values for each one-dimensional feature across the resulting 11 layout variants. FIG. 12B is a layout quality plot illustrating the measured minimum values for each two-dimensional feature across the resulting 11 layout variants. For each feature, the layout gets denser (from variant 1 L0 to variant 11 L1) as one moves from left to right.

The following useful information can be inferred from the layout quality plots of FIGS. 12A and 12B:

1. Sensitivity: it can be seen that DIST_L5_L5 (feature 2), DIST_L1_L1_tag (feature 10) and AREA_L3_L4 (feature 13) are highly sensitive to changes in the layout, while DIST_L7_L1 (feature 6) and DIST_L1_L1 (feature 9) are less sensitive. This information can be used to make targeted changes to the design or the process for the relevant mask levels to reduce the sensitivity, and can also provide useful guidance for debugging hardware failures.

2. Tradeoffs: certain features improve while others worsen; e.g., DIST_L4_L4 (feature 1) and AREA_L7_L5 (feature 14) improve, while many others worsen. This can help to identify critical dependencies while trying to make design choices to improve one part of the layout and how it may affect something else.

3. Optimum points: L3-L3 distance (feature 3) shows a possibly unexpected improvement at variant 8. Careful analysis of the post-simulation contours shows that this is because of the nonlinear proximity effects in sub-wavelength lithography. A neighboring shape on the same level influences the distance between these two shapes. Such design features can be identified and possibly incorporated into any variant that is finally chosen.

4. Feasible variants: it is clear from FIGS. 12A and 12B that variants 1-3 have margins for all features and variant 3 is the densest of these.

Given these results, one can choose variant 3 as the best option. However, one finds that the L5-L5 short in variant 4 occurs because of the non-square aspect ratio of the L5 shapes. By changing these to squares, one can eliminate these shorts, making variant 7 the densest variant that has margin for all features. To compare this flow to a DRC-driven flow, DRC on L0, the relaxed layout can be run. Even though L0 is printable, there are 40 unique high density-specific design rules that are violated by it. Note that only those design rules that are extra-aggressive to enable high density layouts are counted. This clearly shows that traditional design rules are now practically useless for high-density layout design.

Figure 13:
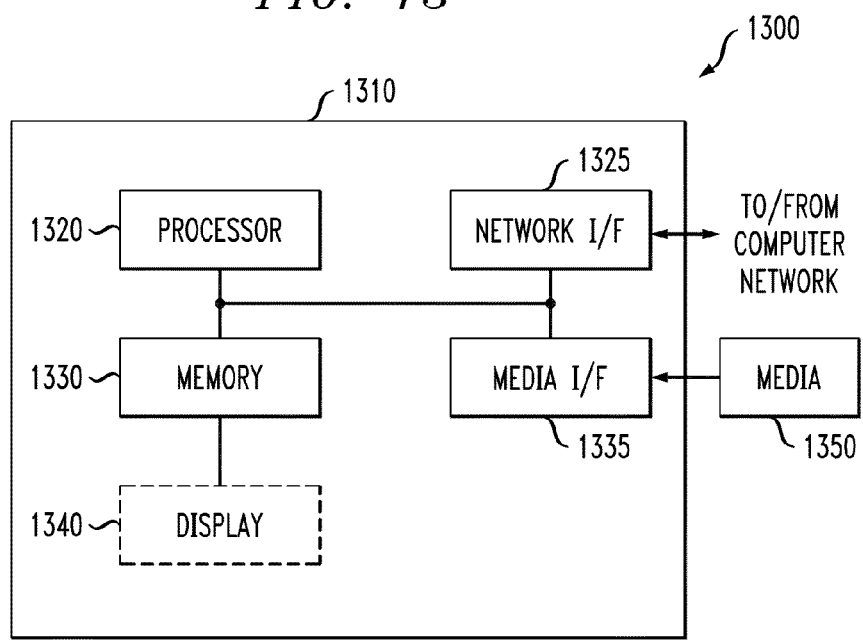
FIG. 13 is a diagram illustrating an exemplary apparatus for performing one or more of the methodologies presented herein according to an embodiment of the present invention.

Turning now to FIG. 13, a block diagram is shown of an apparatus 1300 for implementing one or more of the methodologies presented herein. By way of example only, apparatus 1300 can be configured to implement one or more of the steps of methodology 200 of FIG. 2 for layout variant generation and/or one or more of the steps of methodology 700 of FIG. 7 for evaluating printing quality of a variant layout.

Apparatus 1300 comprises a computer system 1310 and removable media 1350. Computer system 1310 comprises a processor device 1320, a network interface 1325, a memory 1330, a media interface 1335 and an optional display 1340. Network interface 1325 allows computer system 1310 to connect to a network, while media interface 1335 allows computer system 1310 to interact with media, such as a hard drive or removable media 1350.

As is known in the art, the methods and apparatus discussed herein may be distributed as an article of manufacture that itself comprises a machine-readable medium containing one or more programs which when executed implement embodiments of the present invention. For instance, when apparatus 1300 is configured to implement one or more of the steps of methodology 200 the machine-readable medium may contain a program configured to obtain at least a first basis layout and a second basis layout for the cell design, wherein the first basis layout and the second basis layout each having a plurality of shapes, each of the shapes being a polygon having a plurality of sides and plurality of vertices; link one or more of the shapes in the first basis layout with one or more of the shapes in the second basis layout that represent a common feature of the cell design resulting in a plurality of linked shapes; and change a location of the vertices of each of the linked shapes, starting with either the first basis layout or the second basis layout, based on a location of the vertices in the first basis layout and the second basis layout to produce the variant layout for the cell design.

The machine-readable medium may be a recordable medium (e.g., floppy disks, hard drive, optical disks such as removable media 1350, or memory cards) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used.

Processor device 1320 can be configured to implement the methods, steps, and functions disclosed herein. The memory 1330 could be distributed or local and the processor device 1320 could be distributed or singular. The memory 1330 could be implemented as an electrical, magnetic or optical memory, or any combination of these or other types of storage devices. Moreover, the term "memory" should be construed broadly enough to encompass any information able to be read from, or written to, an address in the addressable space accessed by processor device 1320. With this definition, information on a network, accessible through network interface 1325, is still within memory 1330 because the processor device 1320 can retrieve the information from the network. It should be noted that each distributed processor that makes up processor device 1320 generally contains its own addressable memory space. It should also be noted that some or all of computer system 1310 can be incorporated into an application-specific or general-use integrated circuit.

Optional video display 1340 is any type of video display suitable for interacting with a human user of apparatus 1300. Generally, video display 1340 is a computer monitor or other similar video display.

In conclusion, techniques are provided herein that may be employed to easily explore a targeted layout design space, with precise through-process patterning quality information. Layout variants are generated by morphing basis layouts provided by the user and evaluated using post-simulation feature measurements guided by user-specified measurement markers. This capability is invaluable for high-density design and design rule development for deep sub-wavelength technologies, given extremely tight product and technology turn-around windows and increasing process and design complexity.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for generating at least one variant layout for a cell design, comprising the steps of:
   obtaining at least a first basis layout and a second basis layout for the cell design, wherein the first basis layout and the second basis layout each comprises a plurality of shapes, each of the shapes being a polygon having a plurality of sides and plurality of vertices;
   linking one or more of the shapes in the first basis layout with one or more of the shapes in the second basis layout that represent a common feature of the cell design resulting in a plurality of linked shapes; and
   changing a location of the vertices of each of the linked shapes, starting with either the first basis layout or the second basis layout, based on a location of the vertices in the first basis layout and the second basis layout to produce the variant layout for the cell design.

2. The method of claim 1, wherein one or more of the linked shapes have at least one of a location and a geometry in the first basis layout which is different from a location and a geometry in the second basis layout.

3. The method of claim 2, wherein the changing step is performed on only the linked shapes that have at least one of a location and a geometry in the first basis layout which is different from a location and a geometry in the second basis layout.

4. The method of claim 1, wherein the first basis layout serves as a source layout and the second basis layout serves as a destination layout.

5. The method of claim 4, further comprising the step of:
changing the location of the vertices of each of the linked shapes, starting with the first basis layout, based on the location of the vertices in the first basis layout and the second basis layout to produce the variant layout for the cell design.

6. The method of claim 1, further comprising the steps of:
making associations between the shapes based on a design purpose of each of the shapes; and
using the associations made between the shapes to link the shapes in the first basis layout with the shapes in the second basis layout that represent a common feature of the cell design.

7. The method of claim 6, wherein the design purpose of each of the shapes is represented by a shape rank value which indicates a relative ordering of the shapes.

8. The method of claim 1, wherein the first basis layout and the second basis layout each contains a same number of shapes.

9. The method of claim 8, further comprising the step of:
removing at least one shape from one or more of the first basis layout and the second basis layout resulting in the first basis layout and the second basis layout each containing the same number of shapes.

10. The method of claim 1, further comprising the step of:
repeating the changing step multiple times to produce a plurality of variant layouts for the cell design.

11. The method of claim 1, further comprising the step of:
extracting the vertices from each of the polygons.

12. The method of claim 1, further comprising the steps of:
determining a patterning quality for the variant layout.

13. The method of claim 12, wherein the step of determining the patterning quality for the variant layout comprises the steps of:
identifying pattern quality defining features in the variant layout;
marking the pattern quality defining features with measurement markers;
performing patterning simulations;
measuring the pattern quality defining features and the measurement markers to determine measured feature values; and
analyzing layout quality using the measured feature values.

14. The method of claim 1, wherein the first basis layout and the second basis layout are obtained from a cell layout designer.

15. An apparatus for generating at least one variant layout for a cell design, the apparatus comprising:
a memory; and
at least one processor device, coupled to the memory, operative to:
obtain at least a first basis layout and a second basis layout for the cell design, wherein the first basis layout and the second basis layout each comprises a plurality of shapes, each of the shapes being a polygon having a plurality of sides and plurality of vertices;
link one or more of the shapes in the first basis layout with one or more of the shapes in the second basis layout that represent a common feature of the cell design resulting in a plurality of linked shapes; and
change a location of the vertices of each of the linked shapes, starting with either the first basis layout or the second basis layout, based on a location of the vertices in the first basis layout and the second basis layout to produce the variant layout for the cell design.

16. The apparatus of claim 15, wherein the at least one processor device is further operative to:
make associations between the shapes based on a design purpose of each of the drawn shapes; and
use the associations made between the shapes to link the shapes in the first basis layout with the shapes in the second basis layout that represent a common feature of the cell design.

17. The apparatus of claim 15, wherein the at least one processor device is further operative to:
repeat the changing step multiple times to produce a plurality of variant layouts.

18. The apparatus of claim 15, wherein the first basis layout and the second basis layout each contains a same number of shapes.

19. An article of manufacture for generating at least one variant layout for a cell design, comprising a machine-readable recordable medium containing one or more programs which when executed implement the steps of:
obtaining at least a first basis layout and a second basis layout for the cell design, wherein the first basis layout and the second basis layout each comprises a plurality of shapes, each of the shapes being a polygon having a plurality of sides and plurality of vertices;
linking one or more of the shapes in the first basis layout with one or more of the shapes in the second basis layout that represent a common feature of the cell design resulting in a plurality of linked shapes; and
changing a location of the vertices of each of the linked shapes, starting with either the first basis layout or the second basis layout, based on a location of the vertices in the first basis layout and the second basis layout to produce the variant layout for the cell design.

20. The article of manufacture of claim 19, wherein the one or more programs which when executed further implement the steps of:
making associations between the shapes based on a design purpose of each of the drawn shapes; and
using the associations made between the shapes to link the shapes in the first basis layout with the shapes in the second basis layout that represent a common feature of the cell design.

21. The article of manufacture of claim 19, wherein the one or more programs which when executed further implement the step of:
repeating the changing step multiple times to produce a plurality of variant cell layouts.

* * * * *